(12) United States Patent
Cho et al.

(10) Patent No.: US 9,736,927 B2
(45) Date of Patent: Aug. 15, 2017

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Suk Hyeon Cho, Suwon-si (KR); Yoong Oh, Suwon-si (KR); Young Gwan Ko, Suwon-si (KR); Yong Ho Baek, Suwon-si (KR); Young Kuk Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/875,241

(22) Filed: Oct. 5, 2015

(65) Prior Publication Data

US 2016/0135289 A1    May 12, 2016

(30) Foreign Application Priority Data

Nov. 10, 2014    (KR) .................. 10-2014-0155458

(51) Int. Cl.
*H05K 1/02*    (2006.01)
*H05K 1/03*    (2006.01)
(Continued)

(52) U.S. Cl.
CPC .......... *H05K 1/0271* (2013.01); *H05K 1/038* (2013.01); *H05K 1/115* (2013.01); *H05K 3/4605* (2013.01);
(Continued)

(58) Field of Classification Search
CPC .. H05K 1/0271; H05K 3/4605; H05K 3/0029; H05K 2201/09854; H05K 2201/0195; H05K 2201/0909; H05K 2201/0187; H05K 3/0052; H05K 3/429; H05K 2201/09536; H05K 3/002; H05K 3/0047; H05K 2201/09581; H05K 1/021; H05K 1/0212; H05K 1/0215; H05K 1/023; H05K 1/0295; H05K 1/14; H05K 1/143; H05K 1/142; H05K 1/144; H05K 1/145; H05K 1/16; H05K 1/162; H05K 1/165; H05K 1/181; H05K 1/182; H05K 1/183; H05K 1/184; H05K 1/185;
(Continued)

(56) References Cited

U.S. PATENT DOCUMENTS

| | | | |
|---|---|---|---|
| 7,091,589 B2* | 8/2006 | Mori ................. | H01L 23/49822 257/686 |
| 8,314,344 B2* | 11/2012 | Sakaguchi ........... | H01L 21/563 174/260 |

(Continued)

FOREIGN PATENT DOCUMENTS

| JP | 2009-290125 A | 12/2009 |
|---|---|---|
| JP | 2014-127701 A | 7/2014 |

(Continued)

*Primary Examiner* — Ishwarbhai B Patel
(74) *Attorney, Agent, or Firm* — NSIP Law

(57) ABSTRACT

There are provided a printed circuit board and a method of manufacturing the same. The printed circuit board include a glass plate, an insulating member penetrating through the glass plate, insulating layers disposed on a first surface and a second surface of the glass plate, and a via through the insulating member.

9 Claims, 4 Drawing Sheets

(51) Int. Cl.
  *H05K 1/11*   (2006.01)
  *H05K 3/06*   (2006.01)
  *H05K 3/40*   (2006.01)
  *H05K 3/46*   (2006.01)
  *H05K 1/18*   (2006.01)
  *H05K 3/00*   (2006.01)
  *H05K 3/42*   (2006.01)

(52) U.S. Cl.
  CPC .............. *H05K 1/181* (2013.01); *H05K 3/002* (2013.01); *H05K 3/0029* (2013.01); *H05K 3/0047* (2013.01); *H05K 3/0052* (2013.01); *H05K 3/429* (2013.01); *H05K 2201/0187* (2013.01); *H05K 2201/0195* (2013.01); *H05K 2201/0909* (2013.01); *H05K 2201/09536* (2013.01); *H05K 2201/09581* (2013.01); *H05K 2201/09827* (2013.01); *H05K 2201/09854* (2013.01); *H05K 2201/10674* (2013.01)

(58) Field of Classification Search
  CPC ..... H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/04; H05K 1/038; H05K 1/0306; H05K 1/115; H05K 1/0298; H05K 3/4038; H05K 3/4644; H05K 3/06; H05K 2201/09827

See application file for complete search history.

(56) References Cited

U.S. PATENT DOCUMENTS

2009/0294161 A1     12/2009  Yoshimura et al.
  2012/0188734 A1*    7/2012   Mikado ............... H05K 1/185
                                                               361/761
  2013/0313010 A1*   11/2013   Rokugawa ........... H05K 1/0298
                                                               174/262

FOREIGN PATENT DOCUMENTS

KR    10-2012-0095426 A    8/2012
  WO    WO 2011/084235 A2    7/2011

* cited by examiner

PRINTED CIRCUIT BOARD AND METHOD OF MANUFACTURING THE SAME

CROSS-REFERENCE TO RELATED APPLICATION

This application claims the benefit under 35 USC 119(a) of Korean Patent Application No. 10-2014-0155458 filed on Nov. 10, 2014, in the Korean Intellectual Property Office, the entire disclosure of which is incorporated herein by reference for all purposes.

BACKGROUND

1. Field

The present disclosure relates to a printed circuit board and a manufacturing method thereof.

2. Description of Related Art

With the recent miniaturization of electronic components, the thickness of printed circuit boards has also decreased. As a result, incidences of deformation, such as warpage or twisting, of printed circuit boards during their manufacturing processes have increased. In order to prevent the above-mentioned incidences of deformation, a glass core structure in which a glass plate is embedded in a core part of a printed circuit board has been suggested.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a glass plate, an insulating member penetrating through the glass plate, insulating layers disposed on a first surface and a second surface of the glass plate, and a via through the insulating member.

The insulating layers may include a fabric reinforcing material.

The insulating member may not include a reinforcing material.

A diameter of the insulating member on the first surface or the second surface of the glass plate may be greater than a diameter of the insulating member on the second surface or the first surface of the glass plate.

The via may have an hourglass shape and a diameter thereof may decrease from both the first surface and the second surface of the glass plate toward a center portion of the glass plate.

The general aspect of the printed circuit board may further include a side insulating member disposed on a side surface of the glass plate, and the side surface of the glass plate may be covered with the side insulating member so as not to be exposed externally.

The general aspect of the printed circuit board may further include upper and lower wiring layers disposed on the insulating layers disposed on upper and lower surfaces of the glass plate, respectively, and the upper wiring layer and the lower wiring layer may be connected to each other by the via.

The general aspect of the printed circuit board may further include an internal wiring layer disposed on the glass plate.

The insulating member may surround the via, and the insulating member may be disposed between the via and the glass plate.

In another general aspect, a method of manufacturing a printed circuit board involves obtaining a glass plate covered with an insulating layer on a first surface of the glass plate, forming a through hole penetrating through the glass plate, forming an insulating member by filling the through hole with a resin, and forming a core part by forming an insulating layer on a second surface of the glass plate, and forming a via penetrating through the insulating member.

The insulating layer may include a fabric reinforcing material.

The insulating member may not include a reinforcing material.

The forming of the through hole may involve forming the through hole penetrating through the glass plate, and widening the through hole by etching the through hole.

The general aspect of the method may further involve forming a groove in the glass plate continuously along a boundary between a plurality of unit regions for individual printed circuit boards, forming a side insulating member by filling the groove with the resin, and forming a printed circuit board by cutting the glass plate along the boundary at a region in which the side insulating member is formed, such that a side surface of the glass plate is not exposed externally.

In another general aspect, a method of manufacturing a printed circuit board may involve obtaining a multilayer structure comprising a glass plate with a thorough hole penetrating through the glass plate, an insulating layer disposed on a first surface of the glass plate, and an insulating member disposed in the through hole of the glass plate; forming a groove in the multilayer structure and forming a side insulating member in the groove; and cutting the multilayer structure along the side insulating member to form a printed circuit board.

The obtaining of the multilayer structure may involve forming the through hole through the glass plate and filling the through hole with a resin to obtain the insulating member.

The multilayer structure may further include a second insulating layer disposed on a second surface of the glass plate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein.

However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

According to an example of the present disclosure, a printed circuit board may exhibit improved reliability through improving adhesiveness of a via formed in a glass core structure.

Printed Circuit Board

Figure 1:
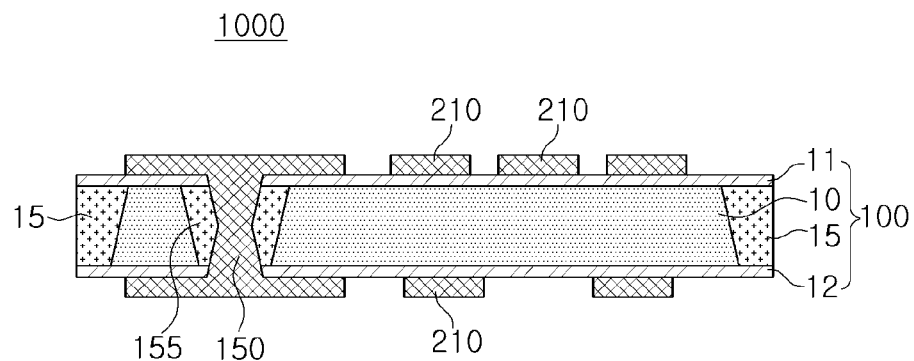
FIG. 1 is a cross-sectional view illustrating an example of a printed circuit board.

FIG. 1 is a cross-sectional view illustrating an example of a printed circuit board.

Referring to FIG. 1, a printed circuit board 1000 includes a core part 100 including a glass plate 10, and insulating layers 11 and 12 disposed on upper and lower surfaces of the glass plate 10, in which the core part 100 includes an insulating member 155 formed to penetrate through the glass plate 10, and a via 150 formed to penetrate through the insulating member 155.

In this example, upper and lower wiring layers 210 are disposed on upper and lower surfaces of the core part 100, and the via 150 connects the upper and lower wiring layers 210 to each other by penetrating through the core part 100. Since the via 150 is formed to penetrate through the insulating member 155, the insulating member 155 surrounding the via 150 may be disposed between the via 150 and the glass plate 10.

The glass plate 10 may include glass which is an amorphous solid.

Examples of a glass material which may be used to form the glass plate 10 include pure silicon dioxide (approximately 100% $SiO_2$), soda lime glass, borosilicate glass, alumino-silicate glass and other silicon-based glass compositions. However, the glass material is not limited to silicon-based glass compositions. For example, alternative types of glass, such as fluoride glass, phosphate glass, or chalcogen glass may also be used.

In addition, in order to form glass having certain physical characteristics, other additives may be further included. The above-mentioned additives may include magnesium, calcium, manganese, aluminum, lead, boron, iron, chromium, potassium, sulfur, and antimony, as well as calcium carbonate (e.g., lime) and sodium carbonate (e.g., soda), and a carbonate and/or an oxide of the above-mentioned elements and other elements.

A through hole may be formed by removing a portion of the glass plate 10 including the glass, and the via 150 may be formed by filling the through hole with a conductive metal. However, when a through hole is formed in such a manner, cracks may occur in an inner wall of the through hole during the removal of the glass plate 10 in order to form the via 150, and delamination may occur due to a difference in coefficients of thermal expansion between the glass plate 10 and the via 150, degrading adhesion.

Therefore, according to one example, reliability may be increased by improving the adhesion of the via in the glass core structure by forming the insulating member 155 on the glass plate 10 and forming the via 150 in the insulating member 155.

The insulating member 155 may include a thermosetting resin such as an epoxy resin, a thermoplastic resin such as polyimide, or the like.

The insulating member 155 according to one example may not include a reinforcing material.

The insulating layers 11 and 12 may be disposed on the upper surface and the lower surface of the glass plate 10 to prevent damage such as breakage of the glass plate 10 by external shock, or the like.

The insulating layers 11 and 12 may include a thermosetting resin such as an epoxy resin or a thermoplastic resin such as polyimide. In addition, the insulating layers 11 and 12 according to an exemplary embodiment may have a fabric reinforcing material, for example, fiberglass impregnated with the resin, and the insulating layers may be formed of, for example, a prepreg.

A diameter of the insulating member 155 may be greater on one surface of the glass plate 10 than on the other surface of the glass plate 10. For example, the insulating member 155 may be formed to have a tapered shape and the diameter thereof is decreased from one surface of the glass plate 10 toward the other surface of the glass plate 10.

The insulating member 155 may be formed by filling the through hole with the resin after forming the through hole penetrating through the glass plate 10. In this case, since the glass plate 10 is apt to cause breakage at the time of the formation of the through hole, the through hole may be formed in a state in which the insulating layer 12 is first formed on one surface of the glass plate 10. Therefore, the insulating member 155 may be formed to have the tapered shape and the diameter thereof is decreased from one surface of the glass plate 10 toward the other surface of the glass plate 10.

In the event that the through hole is formed in the glass plate 10, the through hole may be formed to be widened by primarily forming the through hole and then secondarily performing an etching operation. By using the etching operation, it is possible to remove the cracks that occurred in the inner wall of the through hole of the glass plate 10 during the through hole forming process while performing the etching operation.

The via 150 may be formed in an hourglass shape and a diameter thereof is decreased from one surface and the other surface of the glass plate 10 toward a center portion of the glass plate 10. However, the shape of the via 150 is not necessarily limited thereto. For example, the via 150 may also be formed in all shapes which are known in the art such as a tapered shape in which the diameter thereof is decreased toward the lower surface of the glass plate 10, a tapered shape in which the diameter thereof is increased toward the lower surface of the glass plate 10, a cylindrical shape, and the like.

A material of the via 150 may be used without limitation as long as it is a conductive metal. For example, the via 150 may include copper (Cu).

The via 150 is formed in the insulating member 155, whereby delamination may be prevented and adhesion may be improved to increase reliability.

The printed circuit board 1000 further includes a side insulating member 15 disposed on a side surface of the glass plate 10. In this example, the entire side surface of the glass plate 10 may be covered with the side insulating member 15 so as not to be exposed externally.

When the glass plate 10 is cut into individual printed circuit boards, the occurrence of cracks in the glass plate 10 may be prevented by the side insulating member 15 covering the side surface of the glass plate 10.

The side insulating member 15 may include a thermosetting resin such as an epoxy resin, a thermoplastic resin such as polyimide, or the like.

According to one example, the side insulating member 15 does not include any reinforcing material.

Figure 2:
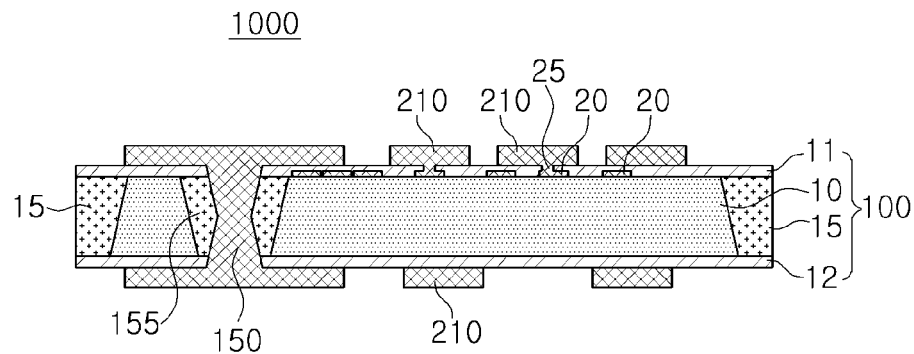
FIGS. 2 and 3 are cross-sectional views illustrating additional examples of printed circuit boards.
Figure 3:
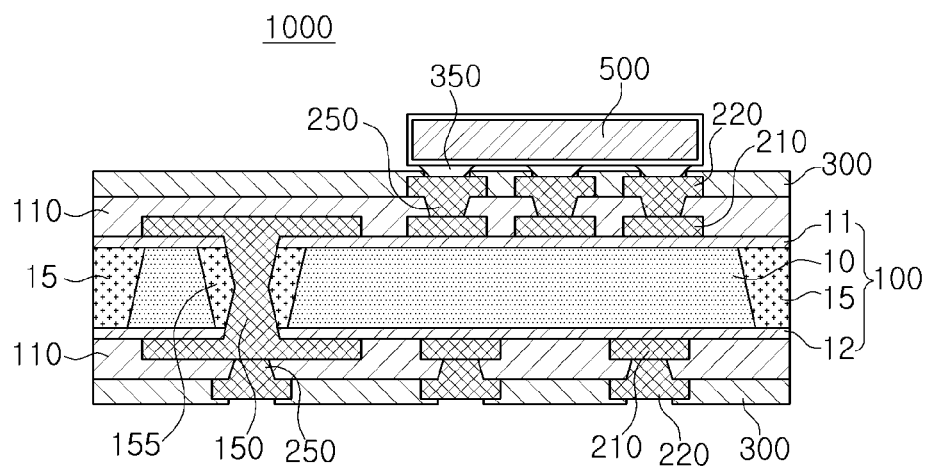

FIGS. 2 and 3 are cross-sectional views illustrating additional examples of printed circuit boards.

Referring to FIG. 2, a printed circuit board 1000 further includes an internal wiring layer 20 disposed on the glass plate 10.

The internal wiring layer 20 may be implemented by a wiring pattern, an inductor, a capacitor, a resistor, or the like. The internal wiring layer 20 may be connected to the wiring layer 210 disposed on one surface of the core part 100 by a via 25.

The configuration of elements other than the internal wiring layer 20 and the via 25 may be the same as that of the printed circuit board according to the example illustrated in FIG. 1.

Referring to the example illustrated in FIG. 3, the wiring layers 210 and 220, and a build-up insulating layer 110 may be disposed on upper and lower surfaces of the core part 100.

The build-up insulating layer 110 may be formed of a thermosetting resin such as an epoxy resin, a thermoplastic resin such as polyimide, or a resin having a reinforcing material such as fiberglass or inorganic filler impregnated therewith, for example, a prepreg.

A material of the wiring layers 210 and 220 may be selected without limitation as long as it is a conductive metal. According to one example, copper (Cu) may be used to form the wiring layers 210 and 220.

A first wiring layer 210 disposed on one surface of the core part 100 and a second wiring layer 220 disposed on one surface of the build-up insulating layer 110 may be connected to each other by a via 250 penetrating through the build-up insulating layer 110.

The via 250 may be made of the same material as the wiring layers 210 and 220. For example, copper (Cu) may be used, but the material of the via 250 is not necessarily limited thereto, and any material may be used without limitation as long as it is used as the conductive metal.

FIG. 1 illustrates an example in which only one build-up layer is stacked on the upper surface and the lower surface of the core part 100; however, the number of build-up layers stacked on the upper surface and the lower surface of the core part 100 is not limited thereto. In another example, two or more build-up layers may be disposed on one surface of the core part 100.

A solder resist 300 may be disposed on a surface of the printed circuit board 1000 so that a wiring pattern for an external terminal connection pad is exposed from the second wiring layer 220, the outermost wiring layer.

A solder bump 350 may be disposed on the exposed wiring pattern for the external terminal connection pad, and a semiconductor chip 500 may be mounted on the solder bump 350.

Method of Manufacturing Printed Circuit Board

FIGS. 4 through 13 are views illustrating an example of a manufacturing process of a printed circuit board according to the present disclosure.

Figure 4:
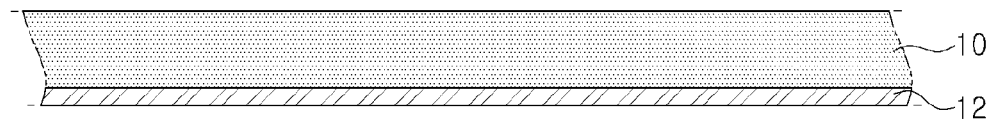
FIGS. 4 through 13 are views sequentially illustrating an example of a method of manufacturing a printed circuit board.

Referring to FIG. 4, a glass plate 10 may first be stacked on an insulating layer 12.

In this example, the glass plate 10 may include pure silicon dioxide ($SiO_2$ of about 100%), soda lime glass, borosilicate glass, alumino-silicate glass, and the like; however, the material for forming the glass plate 10 is not limited to silicon-based glass compositions. In another example, fluoride glass, phosphate glass, chalcogen glass, and the like, which are alternative types of glass, may be used.

The insulating layer 12 may include a thermosetting resin such as an epoxy resin or a thermoplastic resin such as polyimide. In addition, the insulating layer 12 according to one example includes a fabric reinforcing material such as, for example, fiberglass impregnated with the resin, and the insulating layers may be formed of, for example, a prepreg.

The glass plate 10 may be divided into unit regions for forming a plurality of printed circuit boards, and a boundary at the time of the cutting of the glass plate 10 into respective regions may be set between the regions for forming individual printed circuit boards.

Figure 5:
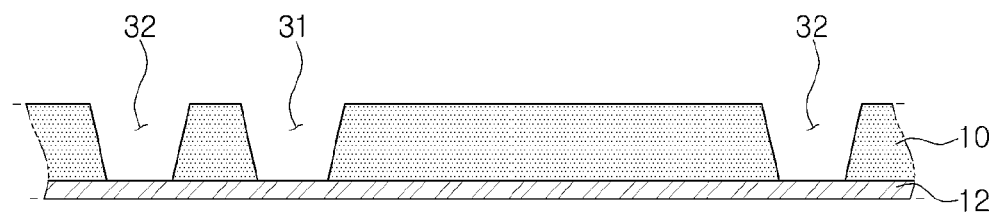

Referring to FIG. 5, a through hole 31 penetrating through the glass plate 10 is formed in the glass plate 10. In addition, a groove 32 is continuously formed in the glass plate 10 along the boundary between the plurality of unit regions for the formation of individual printed circuit boards.

The through hole 31 and the groove 32 may be formed by mechanical drilling, laser drilling, or the like, but is not limited thereto.

According to one example, the through hole 31 may be formed by primarily forming the through hole using laser, or the like, and then secondarily performing an operation of widening the through hole by chemical etching. By using a chemical etching process, the cracks that occurred in the inner wall of the through hole of the glass plate 10 during the through hole forming process may be removed during the etching operation.

Meanwhile, since the glass plate 10 is apt to cause breakage at the time of the formation of the through hole, the through hole 31 may be formed in a state in which the insulating layer 12 is first formed on one surface of the glass plate 10. Therefore, the diameter of the through hole 31 may have be greater on one surface of the glass plate 10 than on the other surface of the glass plate 10. For example, the through hole 31 may be formed to have a tapered shape in which the diameter thereof is decreased from one surface of the glass plate 10 to the other surface of the glass plate 10.

Figure 6:
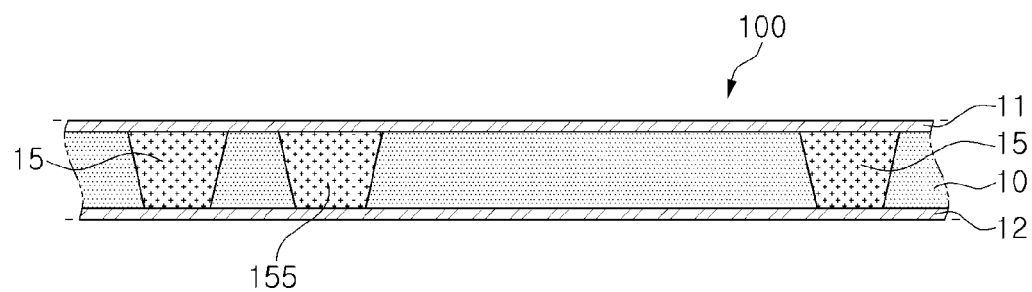

Referring to FIG. 6, an insulating member 155 is formed by filling the through hole 31 with resin, and a side insulating member 15 is formed by filling the groove 32 with resin. In addition, the core part 100 is formed by stacking an insulating layer 11 on the other surface of the glass plate 10.

The insulating member 155 and the side insulating member 15 may include a thermosetting resin such as an epoxy resin, a thermoplastic resin such as polyimide, or the like.

According to one example, the insulating member 155 and the side insulating member 15 does not include any reinforcing material.

The insulating layer 11 may include a thermosetting resin such as an epoxy resin or a thermoplastic resin such as polyimide. In addition, the insulating layer 12 may include a fabric reinforcing material such as, for example, fiberglass included in and impregnated with the resin, and the insulating layers may be formed of, for example, a prepreg.

According to one example, the core part 100 in which the insulating layer 11 is stacked on the upper surface of the glass plate 10 is formed by forming the insulating layer 11 on the upper surface of the glass plate 10 and then heating and compressing the insulating layer 11, and the resin is filled in the through hole 31 and/or the groove 32; however, the formation of the core part 100, and the filling of the resin in the through hole 31 and/or the groove 32 are not necessarily limited thereto.

Figure 7:
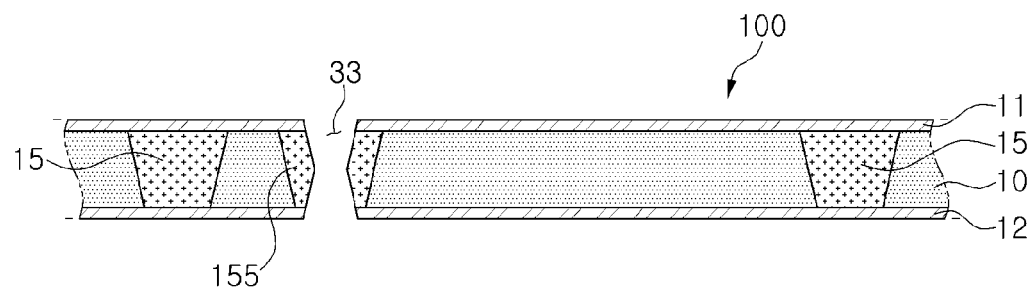

Referring to FIG. 7, a via hole 33 penetrating through the insulating member 155 is formed in the core part 100.

The via hole 33 may be formed using mechanical drilling, laser drilling, sand blasting, chemical etching, or the like, but the method of forming the via hole 33 is not limited thereto.

In the event that the via hole is directly formed in the glass plate when the via hole penetrating through the core part is formed, cracks may occur in an inner wall of the via hole formed in the glass plate. According to one example, the occurrence of the cracks in the glass plate 10 may be prevented by forming the via hole 33 to penetrate through the insulating member 155.

Figure 8:
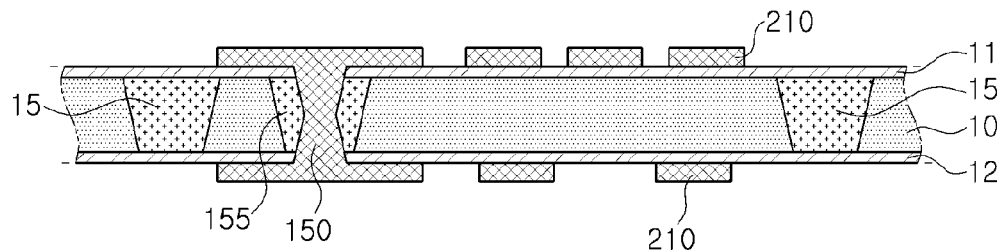

Referring to FIG. 8, the via 150 may be formed by filling the via hole 33 with a conductive metal, and the first wiring layers 210 which are connected to each other by the via 150 may be formed on one surface of the core part 100 and the other surface of the core part 100.

The filling of the conductive metal for forming the via 150 and the formation of the first wiring layer 210 may be, for example, performed by using a plating method or the like, and the conductive metal may be used without limitation as long as it has excellent electric conductivity. For example, copper (Cu) may be used.

According to one example, since the via is not directly formed in the glass plate 10, but the via 150 is formed in the insulating member 155, plating processability may be improved and reliability may be increased by improving the adhesion of the via in the glass core structure.

Figure 9:
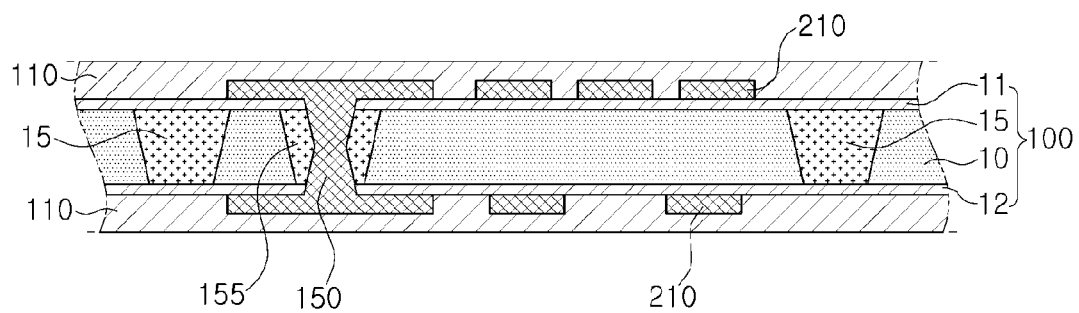

Referring to FIG. 9, the build-up insulating layer 110 may be formed on the first wiring layer 210.

The build-up insulating layer 110 may be formed of a thermosetting resin such as an epoxy resin, a thermoplastic resin such as polyimide, or a resin having a reinforcing material such as fiberglass or inorganic filler impregnated therewith, for example, a prepreg.

Figure 10:
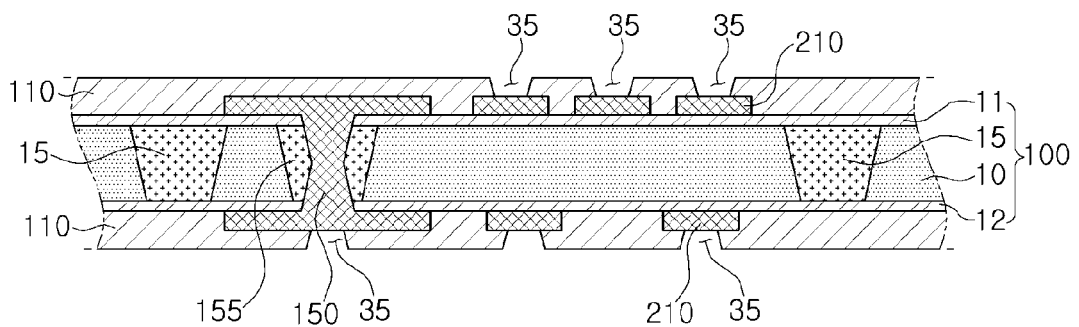

Referring to FIG. 10, via holes 35 penetrating through the build-up insulating layer 110 are formed in the build-up insulating layer 110.

The via hole 35 may be formed using mechanical drilling, laser drilling, sand blasting, or the like; however, the method for forming the via hole 35 is not limited thereto.

Figure 11:
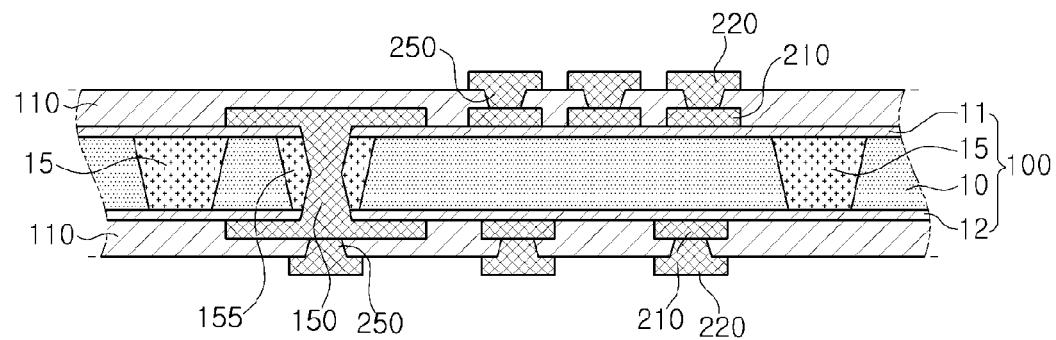

Referring to FIG. 11, a via 250 is formed by filling the via hole 35 with a conductive metal, and a second wiring layer 220 connected to the first wiring layer 210 by the via 250 is formed on the build-up insulating layer 110.

The filling of the conductive metal and the formation of the second wiring layer 220 may, for example, be performed by using a plating method or the like, and a conductive metal with excellent electric conductivity may be used without limitation to from the second wiring layer 220. For example, copper (Cu) may be used as the conductive metal.

Two or more build-up layers (not shown) may be formed on one surface of the core part 100 by repeating the operation of forming the via 250 and the second wiring layer 220.

Figure 12:
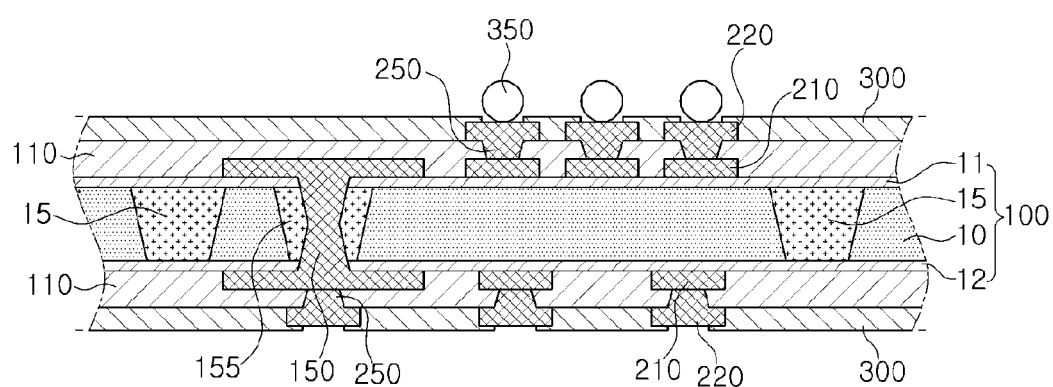

Referring to FIG. 12, the solder resist 300 is formed so that the wiring pattern for the external terminal connection pad is exposed from the second wiring layer 220, which is the outermost wiring layer, and the solder bump 350 capable of mounting the semiconductor chip thereon may be formed on the exposed wiring pattern for the external terminal connection pad.

Figure 13:
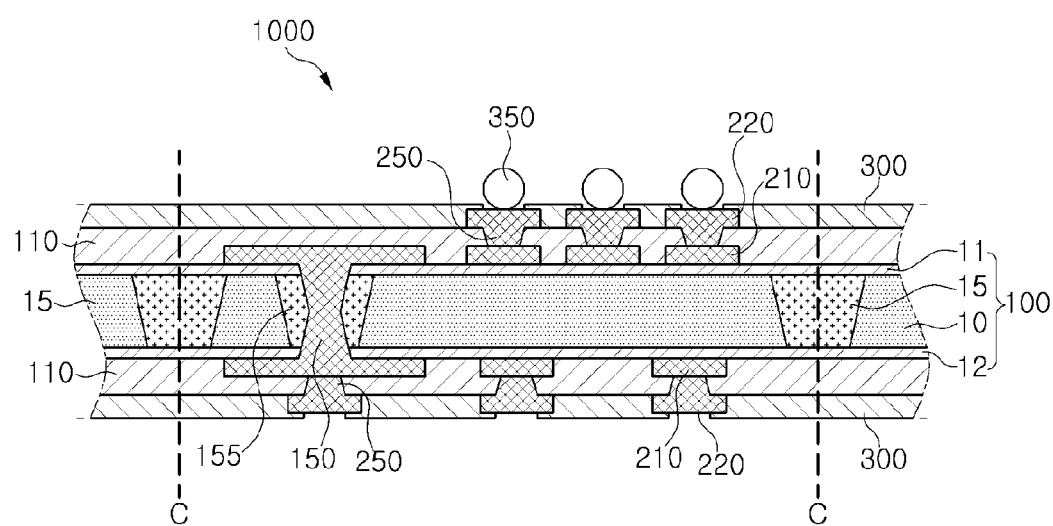

Referring to FIG. 13, the individual printed circuit boards 1000 is formed by cutting the manufactured stacked substrate along the boundary C.

In this example, the glass plate 10 is not cut, and the side insulating member 15 formed along the boundary is cut. The side surface of the glass plate 10 is not exposed externally in the cut printed circuit board 1000 because a remaining portion of the side insulating member 15 covers the glass plate 10.

According to this example, the occurrence of cracks in the glass plate during the cutting of the glass plate into the individual printed circuit boards may be prevented by forming the printed circuit board 1000 by forming the side insulating member 15 covering the side surface of the glass plate 10 and cutting the region of the glass plate in which the side insulating member 15 is formed.

Since other features of the printed circuit board according to this example are the same as those of the printed circuit board according to the previous example, a description thereof will be omitted.

As set forth above, according to an example of a manufacturing method described above, the printed circuit board may have improved reliability through improving adhesiveness of the via formed in the glass core structure.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a glass plate;
   an insulating member penetrating through the glass plate;
   insulating layers disposed on a first surface and a second surface of the glass plate; and
   a via through the insulating member,
   wherein an outer diameter of the insulating member becomes narrower from the first surface to the second surface of the glass plate, and
   wherein an inner diameter of the insulating member becomes narrower from the first surface and the second surface of the glass plate to a middle region of the insulating member.

2. The printed circuit board of claim 1, wherein the insulating layers comprise a fabric reinforcing material.

3. The printed circuit board of claim 1, wherein the insulating member does not comprises a reinforcing material.

4. The printed circuit board of claim 1, wherein a diameter of the insulating member on the first surface or the second surface of the glass plate is greater than a diameter of the insulating member on the second surface or the first surface of the glass plate.

5. The printed circuit board of claim 1, wherein the via has an hourglass shape and a diameter thereof decreases from both the first surface and the second surface of the glass plate toward a center portion of the glass plate.

6. The printed circuit board of claim 1, further comprising a side insulating member disposed on a side surface of the glass plate,
   wherein the side surface of the glass plate is covered with the side insulating member so as to be not exposed externally.

7. The printed circuit board of claim 1, further comprising upper and lower wiring layers disposed on the insulating layers disposed on upper and lower surfaces of the glass plate, respectively,
   wherein the upper wiring layer and the lower wiring layer are connected to each other by the via.

8. The printed circuit board of claim 1, further comprising an internal wiring layer disposed on the glass plate.

9. The printed circuit board of claim 1, wherein the insulating member surrounds the via, and the insulating member is disposed between the via and the glass plate.

* * * * *